US006513226B2

(12) United States Patent
Iwai et al.

(10) Patent No.: US 6,513,226 B2
(45) Date of Patent: Feb. 4, 2003

(54) METHOD OF MANUFACTURING FILM STRUCTURE, METHOD OF MANUFACTURING OPTICAL WAVEGUIDE SUBSTRATE AND METHOD OF MANUFACTURING SECOND HARMONIC GENERATION DEVICE

(75) Inventors: Makoto Iwai, Kasugai (JP); Makoto Ohmori, Nagoya (JP); Takashi Yoshino, Aichi Pref. (JP)

(73) Assignee: NGK Insulators, Ltd., Nagoya (JP)

( * ) Notice: Subject to any disclaimer, the term of this patent is extended or adjusted under 35 U.S.C. 154(b) by 98 days.

(21) Appl. No.: 09/817,405

(22) Filed: Mar. 26, 2001

(65) Prior Publication Data

US 2001/0046552 A1 Nov. 29, 2001

(30) Foreign Application Priority Data

Mar. 28, 2000 (JP) .................................... 2000-088262

(51) Int. Cl.⁷ ................................................ H01P 11/00
(52) U.S. Cl. ...................... 29/600; 359/332; 385/130
(58) Field of Search .............................. 29/600; 117/84, 117/948; 359/328, 332; 385/129, 130, 131, 132, 141, 142, 143, 144, 145

(56) References Cited

U.S. PATENT DOCUMENTS 5,363,462 A * 11/1994 Hung et al. ................ 359/326
5,581,396 A    12/1996 Kubota et al.
5,690,734 A    11/1997 Imaeda et al.
5,785,898 A     7/1998 Hofmeister et al.
6,353,495 B1 *  3/2002 Mizuuchi et al. .......... 359/326

FOREIGN PATENT DOCUMENTS

| EP | 0 768 393 A1 | 4/1997 |
| JP | 08-006083 | 1/1996 |
| JP | 08-259375 | 10/1996 |
| JP | 08-319191 | 12/1996 |

OTHER PUBLICATIONS

Kiyofumi Chikuma, Atsushi Onoe, and Ayako Yoshida, "Waveguiding Epitaxial Potassium Lithium Niobate Single–Crystal Films Deposited by Metalorganic Chemical Vapor Deposition," Part 1, No. 10, Oct. 1998, Jpn. J. Appl. Phys. vol. 37(1998) pp. 5582–5587.

* cited by examiner

Primary Examiner—Charles R. Eloshway
Assistant Examiner—Peter deVore
(74) Attorney, Agent, or Firm—Burr & Brown

(57) ABSTRACT

A film made of a single crystal of potassium lithium niobate is formed on a substrate made of a single crystal of potassium lithium niobate-potassium lithium tantalate solid solution. In this film formation, a temperature of the substrate is maintained in a range of 700° C.–850° C. and the film is formed by a metalorganic chemical vapor deposition method. By utilizing the film structure mentioned above, it is possible to generate a second harmonic wave in the optical waveguide with high efficiency.

9 Claims, No Drawings

METHOD OF MANUFACTURING FILM STRUCTURE, METHOD OF MANUFACTURING OPTICAL WAVEGUIDE SUBSTRATE AND METHOD OF MANUFACTURING SECOND HARMONIC GENERATION DEVICE

BACKGROUND OF THE INVENTION

1. Field of the Invention

The present invention relates to a method of manufacturing a film structure in which a film made of a single crystal of potassium lithium niobate or a film made of a single crystal of potassium lithium niobate-potassium lithium tantalate solid solution is formed on a surface of a substrate made of a single crystal of potassium lithium niobate-potassium lithium tantalate solid solution, and also relates to a method of manufacturing an optical waveguide substrate and a second harmonic generation device utilizing the above manufacturing method.

2. Description of Related Art

A single crystal of potassium lithium niobate and a single crystal of potassium lithium niobate-potassium lithium tantalate solid solution have attracted much attention as a single crystal for a second harmonic generation (SHG) device generating a blue light used for a semiconductor laser. The single crystal mentioned above can convert to an ultraviolet ray having a wavelength of 390 nm. Therefore, by utilizing such a short wave light, the single crystal mentioned above can be applied in various fields such as optical disc memory, DVD laser light source, laser pointer, medical science, photo-chemistry, various kinds of light measurements. In addition, since the single crystal mentioned above has a large electro-optics effect, it can be applied for an optical memory device and so on utilizing its photorefractive effect.

In an optical application, particularly, a second harmonic generation application, it is necessary to transmit a short wavelength laser light having a wavelength of for example 400 nm in the single crystal with a large output density as large as possible. In addition, it is also necessary to suppress a optical damage as small as possible. In this manner, a optical damage must be suppressed, but for this purpose it is necessary to use a single crystal having excellent crystallinity that constitutes the optical waveguide. Moreover, it is necessary to use the optical waveguide having a single domain structure. Therefore, from a practical viewpoint, the single crystal mentioned above is required to generate a second harmonic wave having a high output such as for example 30 mW.

In Japanese Patent Laid-Open Publication No. 8-6083 (JP-A-8-6083), an epitaxial clad layer made of a single crystal of potassium lithium niobate-potassium lithium tantalate solid solution is arranged on a surface of a substrate made of a single crystal of potassium lithium niobate, and an optical waveguide made of the solid solution single crystal mentioned above is formed on the clad layer by a metalorganic chemical vapor deposition method. However, in this device, a optical damage still remains, and a second harmonic output does not reach to a high level mentioned above.

In Jpn. J. Appl. Phys. Vol. 37 (1988) pp. 5582–5587, a potassium lithium niobate film is formed on a (111) Si substrate by a metalorganic chemical vapor deposition method. However, since a crystal structure of potassium lithium niobate is remarkably different from a crystal structure of (111) Si, a polycrystal film is formed.

SUMMARY OF THE INVENTION

An object of the invention is to generate a film having excellent crystallinity made of a single crystal of potassium lithium niobate or a film made of a single crystal of potassium lithium niobate-potassium lithium tantalate solid solution on a substrate made of a single crystal of potassium lithium niobate-potassium lithium tantalate solid solution.

Moreover, an another object of the invention is to provide an optical waveguide having a small optical damage and to increase largely a second harmonic generation output.

According to the invention, a method of manufacturing a film structure in which a film is formed on a surface of a substrate, comprises the steps of: preparing a substrate made of a single crystal of potassium lithium niobate-potassium lithium tantalate solid solution; and forming a film made of a single crystal of potassium lithium niobate or a film made of a single crystal of potassium lithium niobate-potassium lithium tantalate solid solution on a surface of the substrate under such a condition that a temperature of the substrate is maintained in a range of 700° C.–850° C. and the film is formed by a metalorganic chemical vapor deposition method.

Moreover, according to the invention, a method of manufacturing an optical waveguide substrate in which an optical waveguide is formed on a surface of the substrate, comprising the steps of: preparing a substrate made of a single crystal of potassium lithium niobate-potassium lithium tantalate solid solution; and forming a film made of a single crystal of potassium lithium niobate or a film made of a single crystal of potassium lithium niobate-potassium lithium tantalate solid solution on a surface of the substrate under such a condition that a temperature of the substrate is maintained in a range of 700° C.–850° C. and the film is formed by a metalorganic chemical vapor deposition method so as to form the optical waveguide.

Further, according to the invention, a method of manufacturing a second harmonic generation device in which an optical waveguide for exchanging a fundamental wave to a second harmonic wave, comprising the steps of: preparing a substrate made of a single crystal of potassium lithium niobate-potassium lithium tantalate solid solution; and forming a film made of a single crystal of potassium lithium niobate or a film made of a single crystal of potassium lithium niobate-potassium lithium tantalate solid solution on a surface of the substrate under such a condition that a temperature of the substrate is maintained in a range of 700° C.–850° C. and the film is formed by a metalorganic chemical vapor deposition method so as to form the optical waveguide.

DESCRIPTION OF THE PREFERRED EMBODIMENT

Features of the present invention is to manufacture a film structure by preparing a substrate made of a single crystal of potassium lithium niobate-potassium lithium tantalate solid solution; and forming a film made of a single crystal of potassium lithium niobate or a film made of a single crystal of potassium lithium niobate-potassium lithium tantalate solid solution on a surface of the substrate under such a condition that a temperature of the substrate is maintained in a range of 700° C.–850° C. and the film is formed by a metalorganic chemical vapor deposition method. After a large number of experiments, the present inventors have found that a crystallinity of the film could be extremely excellent and a optical damage could be remarkably reduced when a temperature of the substrate was maintained in a range of 700° C.–850° C. and the film was formed by a metalorganic chemical vapor deposition method. Then, if the film obtained as mentioned above was applied to a second harmonic generation device, a second harmonic generation output was remarkably improved, and particularly an output over 30 mW could be obtained stably. In this manner, the present invention was achieved.

The reason for obtaining these effects is to improve remarkably a crystallinity of the single crystal made of potassium lithium niobate that forms the film. In addition, another reason is that the film has a single domain structure.

That is to say, Curie point of the single crystal of potassium lithium niobate-potassium lithium tantalate solid solution is varied corresponding to a ratio of respective elements such as lithium, niobium, tantalum, but it is about in a temperature range of 450–550° C. Therefore, even if use is made of the substrate made of the single crystal having a single domain structure by maintaining a temperature of the substrate over 700° C. Therefore, it is assumed that the film formed on a surface of the substrate becomes also a multi domain structure. In this case, a crystallinity of the film is deteriorated. In addition, in order to use the film having the multi domain structure as an optical device, it is necessary to make the film to the single domain structure again, but a crystallinity of the film is deteriorated again during a single domain structure formation.

However, it was confirmed that, when the film was formed by a metalorganic chemical vapor deposition method at a temperature over 700° C. under the above mentioned combination of the substrate material and the film material, the film became a single domain structure and its crystallinity was not deteriorated at all even if the substrate had a multi domain structure. The reason why is not clear, but it is assumed that a heat conduction from the substrate to the film is balanced at a certain degree by a crystal lattice deviation between the substrate material and the film material or by cooling the film continuously in an atmosphere.

In JP-A-8-6083, it is disclosed that the optical waveguide is formed on the clad layer by a metalorganic chemical vapor deposition method in a temperature range of 500–700° C. However, the substrate is a single crystal of potassium lithium niobate and the optical waveguide is formed thereon via the clad layer. In addition, in order to make a refractive index of the optical waveguide little larger than that of the epitaxial clad layer, a ratio of niobium with respect to lithium in the optical waveguide is made little larger than that in the clad layer (an amount of niobium is little increased) under the condition such that an exchanging ratio y of tantalum between the optical waveguide and the clad layer. Therefore, it is not disclosed in JP-A-8-6083 that a temperature of the substrate is maintained in a range of 700–850° C. under the combination of the substrate material and the film material according to the invention, so that the effects of the present invention is not obtained.

According to the second harmonic generation device of the present invention, it is possible to generate a short wavelength light having a wavelength of for example 390 nm–470 nm. Therefore, such a short wavelength light can be preferably applied to a wide field such as optical disc memory, medical science, photochemistry, various kinds of light measurements and so on.

In order to realize the effects of the present invention, it is preferred to maintain a temperature of the substrate in a range of 740° C.–780° C.

Chemical compositions of the single crystals constituting the substrate and the film are not limited so long as maintaining tungsten-bronze structure made of K, Li, Nb, Ta and O. However, in order to use the film for the optical waveguide particularly for the optical waveguide used for a wavelength converting, it is necessary to control a refractive index difference between the substrate and the film. From this standpoint, it is preferred to use fundamental chemical compositions mentioned below, and the fundamental chemical compositions mentioned below is preferably applied to the manufacturing method according to the invention.

(1) Fundamental chemical composition of the film:

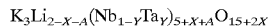

$K_3Li_{2-X-A}(Nb_{1-Y}Ta_Y)_{5+X+A}O_{15+2X}$ (here, X is 0.10–0.50 more preferably 0.10–0.20. Y is an exchanging rate of tantalum with respect to niobium and is 0.00–0.05 more preferably 0.00–0.01. A is 0.006–0.12 more preferably 0.006–0.02)

(2) Fundamental chemical composition of the substrate:

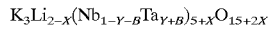

$K_3Li_{2-X}(Nb_{1-Y-B}Ta_{Y+B})_{5+X}O_{15+2X}$ (here, X is 0.10–0.50 more preferably 0.10–0.20. Y is an exchanging rate of tantalum with respect to niobium and is 0.00–0.05 more preferably 0.00–0.01. B is 0.005–0.5 more preferably 0.03–0.1)

In the most preferable embodiment, Y is 0.

As respective materials of the substrate and the film, it is assumed that use is made of the materials having tungsten-bronze structure made of K, Li, Nb, Ta and O as mentioned above. However, it is possible to exchange respective elements. For example, it is possible to exchange K, Li by Na, Rb and so on. In this case, it is preferred to control an exchanging rate under 10 atm % when potassium or lithium is assumed to be 100 atm %. Moreover, it is possible to add a doping agent for laser oscillation such as Cr or rare earth such as Er, Nd.

As the substrate, it is preferred to use the substrate obtained according to a micro pull-down method disclosed in Japanese Patent Laid-Open Publication No. 8-259375 and Japanese Patent Laid-Open Publication No. 8-319191 filed by the present applicant.

As the metalorganic chemical vapor deposition method, use is made of niobium source, potassium source and lithium source. As the niobium source, it is preferred to use penta-ethoxyniobium [$Nb(OC_2H_5)_5$]. As the potassium source, it is preferred to use potassium dipivaloymethanate [$K(C_{11}H_{19}O_2)$]. As the lithium source, it is preferred to use lithium dipivaloymethanate [$Li(C_{11}H_{19}O_2)$].

Hereinafter, an actual experiment will be explained.

Experiment

A substrate made of a single crystal of potassium lithium niobate-potassium lithium tantalate was prepared according to the micro pull-down method. That is to say, potassium carbonate, lithium carbonate, niobium carbonate and tantalum carbonate were mixed with each other at a mix composition ratio of 30.0:24.0:45.08:0.92 so as to manufacture a raw material powder. About 50 g of the raw material powder was supplied in a platinum crucible and was heated to 1150° C. so as to melt the raw material powder. In this case, a temperature of an upper space of a furnace was controlled in a range of 1100–1200° C. so as to melt the raw material in the crucible. Then, a temperature of a single crystal growing portion was controlled in a range of 1050° C.–1150° C., and a plate of C plane was pulled down from a nozzle provided at a bottom surface of the crucible along a-axis direction of the crystal at a pull-down rate of 10 mm/hour. As a result, a substrate made of a single crystal having a dimension of thickness 1 mm, width: 30 mm and length: 100 mm was grown. The thus obtained substrate was used as an under-clad portion. A chemical composition of the substrate was $K_3Li_{1.9}(Nb_{0.97}Ta_{0.03})_{5.1}O_{15.2}$.

Then, according to a metalorganic chemical vapor deposition method, a film made of a single crystal was formed. As precursors, use was made of potassium dipivaloymethanate $[K(C_{11}H_{19}O_2)]$, lithium dipivaloymethanate $[Li(C_{11}H_{19}O_2)]$ and pentaethoxyniobium $[Nb(OC_2H_5)_5]$. These precursors were filled respectively in respective stainless steel containers and were heated at their sublimation temperatures respectively so as to obtain respective precursor gasses. Then, the thus obtained precursor gases were introduced respectively into a reaction chamber by utilizing a flow-rate controlled argon carrier gas. That is to say, respective gases were diluted by argon gas having a flow rate of 880 sccm. A flow rate of oxygen gas was 200 sccm. A total flow rate of mixture gas including the above diluting argon gas and the above oxygen gas and respective precursor gases shown in the following Table 1 was 2000 sccm. Flow rates, temperatures and pressures of respective precursor gases were shown in the following Table 1.

TABLE 1

| Kind of precursors | Temperature (° C.) | Pressure (Torr) | Flow rate (sccm) |
| --- | --- | --- | --- |
| K $(C_{11}H_{19}O_2)$ | 187 | 40 | 180 |
| Li $(C_{11}H_{19}O_2)$ | 188 | 40 | 240 |
| Nb $(OC_2H_5)_5$ | 118 | 160 | 500 |

Then, a pressure in the reaction chamber was maintained at 40 Torr, and a temperature of the substrate was varied as shown in the following Table 2. Pipes toward the reaction chamber were heated to 250° C. A film forming time was 8 hours. In this manner, a film having a smooth surface could be obtained. A thickness of the film was measured by a prism coupling method. As a result, a thickness of the film was 4.0–4.5 μm. An ordinary light refractive index of the film was 2.2785 and an extraordinary light refractive index of the film was 2.131. A chemical composition of the thus obtained film was $K_3Li_{1.85}Nb_{5.15}O_{15.3}$. A half band width of X-ray locking curves of respective films were measured. The measured results were also shown in the following Table 2.

Strip patterns of titanium film each having a dimension of thickness: 1 μm, width: 5 μm and length: 25 mm were formed on the thus obtained epitaxial film with an interval of 2 mm by utilizing a normal photolithography method. The thus obtained sample was worked by a reactive ion-etching method. In this case, use was made of $C_2F_6$ gas and $O_2$ gas, and a reactive ion-etching was performed under such a condition that pressure was 0.02 Torr, RF power was 250 W and working time was 100 hours. As a result, the optical waveguide having a ridge structure was manufactured.

Then, the thus obtained sample was cut out so as to obtain a chip device having a length along the optical waveguide direction of 10 mm and a width of 2 mm. An input end surface and an output end surface of the chip were optically polished. Then, an antireflection coating having a refractive index of 0.5% at 860 nm was formed on the input end surface, and an anti-reflection coating having a refractive index of 0.5% at 430 nm was formed on the output end surface. After that, when a titanium-sapphire laser light was incident into the optical waveguide, a phase match occurred at 857 nm. Then, when a power of incident light was 100 mW, a second harmonic generation output from the chip was measured. The measured results were also shown in the following Table 2.

TABLE 2

| Sample No. | Substrate temperature (° C.) | FWMH of X-ray rocking curve (004) (second)* | SHG (output) (mW) |
| --- | --- | --- | --- |
| 1 | 600 | 450 | no generation |
| 2 | 620 | 380 | less than 1 |
| 3 | 640 | 320 | 2 |
| 4 | 660 | 240 | 10 |
| 5 | 680 | 210 | 18 |
| 6 | 690 | 140 | 22 |
| 7 | 700 | 100 | 28 |
| 8 | 720 | 60 | 28 |
| 9 | 740 | 40 | 36 |
| 10 | 760 | 35 | 35 |
| 11 | 780 | 34 | 35 |
| 12 | 800 | 35 | 30 |
| 13 | 820 | 38 | 31 |
| 14 | 850 | 38 | 31 |
| 15 | 860 | 150 | 22 |
| 16 | 870 | 390 | 14 |

*X-ray rocking curve was measured with (004) reflection by Philips MRD. Wavelength of the X-ray was 1.5406 nm (Cu-Kα)

As mentioned above, according to the invention, the film made of a single crystal of potassium lithium niobate having an excellent crystallinity can be formed on the substrate made of a single crystal of potassium lithium niobate-potassium lithium tantalate solid solution. By utilizing the thus obtained film structure according to the invention, it is possible to provide the optical waveguide having a small optical damage and also it is possible to increase a second harmonic generation output.

What is claimed is:

1. A method of manufacturing a film structure in which a film is formed on a surface of a substrate, comprising the steps of:

preparing a substrate made of a single crystal of potassium lithium niobate-potassium lithium tantalate solid solution; and forming a film made of a single crystal of potassium lithium niobate or a film made of a single crystal of potassium lithium niobate-potassium lithium tantalate solid solution on a surface of the substrate under such a condition that a temperature of the substrate is maintained in a range of 700° C.–850° C. and the film is formed by a metalorganic chemical vapor deposition method.

2. The method according to claim 1, wherein a chemical composition of the film is

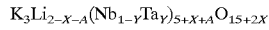
$$K_3Li_{2-X-A}(Nb_{1-Y}Ta_Y)_{5+X+A}O_{15+2X}$$

(here, X is 0.10–0.50 more preferably 0.10–0.20. Y is an exchanging rate of tantalum with respect to niobium and is 0.00–0.05 more preferably 0.00–0.01. A is 0.006–0.12 more preferably 0.006–0.02).

3. The method according to claim 1, wherein a chemical composition of the substrate is

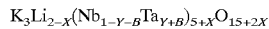
$$K_3Li_{2-X}(Nb_{1-Y-B}Ta_{Y+B})_{5+X}O_{15+2X}$$

(here, X is 0.10–0.50 more preferably 0.10–0.20. Y is an exchanging rate of tantalum with respect to niobium and is 0.00–0.05 more preferably 0.00–0.01. B is 0.005–0.5 more preferably 0.03–0.1).

4. A method of manufacturing an optical waveguide substrate in which an optical waveguide is formed on a surface of the substrate, comprising the steps of:

preparing a substrate made of a single crystal of potassium lithium niobate-potassium lithium tantalate solid solution; and forming a film made of a single crystal of potassium lithium niobate or a film made of a single crystal of potassium lithium niobate-potassium lithium tantalate solid solution on a surface of the substrate under such a condition that a temperature of the substrate is maintained in a range of 700° C.–850° C. and the film is formed by a metalorganic chemical vapor deposition method so as to form the optical waveguide.

5. The method according to claim 4, wherein a chemical composition of the film is $$K_3Li_{2-X-A}(Nb_{1-Y}Ta_Y)_{5+X+A}O_{15+2X}$$

(here, X is 0.10–0.50 more preferably 0.10–0.20. Y is an exchanging rate of tantalum with respect to niobium and is 0.00–0.05 more preferably 0.00–0.01. A is 0.006–0.12 more preferably 0.006–0.02).

6. The method according to claim 4, wherein a chemical composition of the substrate is $$K_3Li_{2-X}(Nb_{1-Y-B}Ta_{Y+B})_{5+X}O_{15+2X}$$

(here, X is 0.10–0.50 more preferably 0.10–0.20. Y is an exchanging rate of tantalum with respect to niobium and is 0.00–0.05 more preferably 0.00–0.01. B is 0.005–0.5 more preferably 0.03–0.1).

7. A method of manufacturing a second harmonic generation device in which an optical waveguide for exchanging a fundamental wave to a second harmonic wave, comprising the steps of:

preparing a substrate made of a single crystal of potassium lithium niobate-potassium lithium tantalate solid solution; and forming a film made of a single crystal of potassium lithium niobate or a film made of a single crystal of potassium lithium niobate-potassium lithium tantalate solid solution on a surface of the substrate under such a condition that a temperature of the substrate is maintained in a range of 700° C.–850° C. and the film is formed by a metalorganic chemical vapor deposition method so as to form the optical waveguide.

8. The method according to claim 7, wherein a chemical composition of the film is $$K_3Li_{2-X-A}(Nb_{1-Y}Ta_Y)_{5+X+A}O_{15+2X}$$

(here, X is 0.10–0.50 more preferably 0.10–0.20. Y is exchanging rate of tantalum with respect to niobium and is 0.00–0.05 more preferably 0.00–0.01. A is 0.006–0.12 more preferable 0.006–0.12).

9. The method according to claim 7, wherein a chemical composition of the substrate is $$K_3Li_{2-X}(Nb_{1-Y-B}Ta_{Y+B})_{5+X}O_{15+2X}$$

(here, X is 0.10–0.50 more preferably 0.10–0.20. Y is an exchanging rate of tantalum with respect to niobium and is 0.00–0.05 more preferably 0.00–0.01. B is 0.005–0.5 more preferably 0.03–0.1).

* * * * *